United States Patent [19]

Lodi

[11] 4,099,264
[45] Jul. 4, 1978

[54] NON-DESTRUCTIVE INTERROGATION CONTROL CIRCUIT FOR A VARIABLE THRESHOLD FET MEMORY

[75] Inventor: Robert J. Lodi, Tewksbury, Mass.

[73] Assignee: Sperry Rand Corporation, New York, N.Y.

[21] Appl. No.: 736,651

[22] Filed: Oct. 28, 1976

[51] Int. Cl.² ............................................. G11C 11/40
[52] U.S. Cl. .................................. 365/189; 365/184; 365/205; 307/297; 307/350
[58] Field of Search ..................... 340/173 R; 307/238; 365/189, 184

[56] References Cited

U.S. PATENT DOCUMENTS

| | | | |
|---|---|---|---|
| 3,914,620 | 10/1975 | Millhollan et al. | 307/215 |
| 3,919,566 | 11/1975 | Millhollan et al. | 307/238 X |
| 4,014,007 | 3/1977 | Groeger | 365/100 |
| 4,014,008 | 3/1977 | Groeger et al. | 365/100 |
| 4,027,285 | 5/1977 | Millhollan et al. | 340/173 R |
| 4,037,218 | 7/1977 | Groeger et al. | 365/104 |

*Primary Examiner*—Bernard Konick
*Assistant Examiner*—Donald McElheny
*Attorney, Agent, or Firm*—Howard P. Terry

[57] ABSTRACT

An illustrative embodiment of the invention provides a substantially non-destructive interrogation circuit for a memory cell such as a variable threshold insulated gate field effect memory transistor device whereby the circuit generates a fixed current for interrogation of the memory transistor such that the disturb voltage, the voltage impressed across the insulator of the memory transistor during interrogation, is minimized and is a function of the current and the gain of the memory device and not the threshold of the memory device. Moreover the disturb voltage is readily calculable and is equal for all interrogations and, therefore, enables one to calculate the maximum number of interrogations of a memory cell before the disturb voltage destroys the memory threshold of the memory cell and rewriting of the data therein must be performed. In addition, a sense latch circuit provides means for sensing the memory data of the memory cell without applying an additional disturb potential to the device.

10 Claims, 3 Drawing Figures

NON-DESTRUCTIVE INTERROGATION CONTROL CIRCUIT FOR A VARIABLE THRESHOLD FET MEMORY

BACKGROUND OF THE INVENTION

1. Field of the Invention

This invention relates to a digital memory circuit and, more particularly, to a circuit for non-destructive reading of a variable threshold insulated gate field effect memory transistor.

2. Description of the Prior Art

Variable threshold transistors that display memory characteristics are known in the prior art. For example, U.S. Pat. No. 3,508,211 entitled "Electrically Alterable Non-Destructive Readout Field Effect Transistor Memory" and assigned to the present assignee, relates to a variable threshold transistor useful as a memory element. Each element is comprised of a variable threshold insulated gate field effect transistor whose conduction threshold is electrically alterable by impressing a binary WRITE voltage between the gate electrode and the substrate in excess of a predetermined finite magnitude. The polarity of the WRITE voltage, moreover, determines the sense in which the threshold is varied. Furthermore, by application of a fixed interrogation voltage or READ voltage, having a value intermediate to the binary value conduction thresholds, to the gate electrode the binary condition of the transistor can be sensed, for example, by monitoring the magnitude of the resulting source to drain current. The value of the variable threshold transistor memory element lies partly in the fact that it is completely compatible with the use of integrated microelectronic circuit fabrication techniques in devices useful in digital computers.

Generally, the magnitude of the interrogation or READ voltage is small and insufficient to substantially change the pre-existing conduction threshold so that essentially a non-destructive readout is achieved. However, in certain systems there is a need for interrogation of the memory transistor device many millions of times before the initiation of a new WRITE signal. In such a system the disturb voltage, produced as a result of the READ voltage, although small for a relatively few READ cycles, may eventually destroy the memory of the device before a new WRITE cycle is or may be employed. Furthermore, during READ voltage interrogation of the memory device, the disturb voltage varies in magnitude and polarity as a function of the threshold voltage of the memory device, which in turn is disturbed by the disturb voltage. Accordingly, it is extremely difficult to calculate the interrogation cycle lifetime of the memory device without actually interrogating the device throughout its lifetime, i.e., until memory destruction. Furthermore, the memory retention of the device also depends upon the inherent qualities of the device and the interrogation scheme used to sense the data of the device. Sensing schemes, moreover, which have been employed to determine the binary value of the memory cells have also applied an additional disturb potential to the memory device which likewise decreases the retention lifetime of the device. Accordingly, it is necessary to provide a memory device, which is to retain operable and valid data after being subjected to a relatively large number of interrogation cycles, with a highly non-destructive interrogation scheme and sensing scheme.

SUMMARY OF THE INVENTION

In accordance with the invention, an interrogation circuit is provided which overcomes the difficulties of the prior art interrogation of memory devices by substantially reducing the disturb potential impressed across a memory transistor device during interrogation which results in a substantially increased memory interrogation lifetime of the device.

Specifically, the interrogation circuit for a variable threshold insulated gate field effect transistor device according to this invention comprises transistor means for generating a constant current interrogation signal whereby the constant current signal is applied to the memory device being interrogated or READ such that the disturb voltage impressed across the insulator of the memory transistor during interrogation does not vary with the threshold voltage of the device but rather is a constant and calculable quantity for all interrogations of the device.

More specifically, an embodiment of this invention includes a variable threshold memory transistor connected to a constant current supply provided by a field effect transistor (FET) whereby the gate of the field effect transistor is driven by a control circuit comprising a plurality of interconnected field effect transistors. In addition, the output voltage of the control circuit supplied to the gate of the current source transistor provides a on-drive voltage for the current source transistor which is automatically compensated for threshold voltage changes of the constant current transistor thus maintaining a constant on-drive for constant current generation by the transistor, which impresses a substantially reduced, constant and calculable disturb voltage across the insulator of the transistor.

A further embodiment of the invention includes a sense/latch circuit which uses as one of its inputs the voltage output of a variable threshold memory transistor and a reference voltage applied to the other input or which uses as its inputs the voltage outputs of a differential memory cell and which provides as its output a latched level corresponding to the data state of the stored information of the memory device or the differential memory cell. The sense/latch circuit includes a high impedance gate input as the connection to the memory transistor or differential transistors to eliminate any feedback effect to the memory device and thereby reduce the disturb potential impressed across the insulator of the memory transistor which increases the interrogation lifetime of the memory transistor. The sense/latch circuit, moreover, may be coupled to a variable threshold memory transistor which, in turn, is coupled to a constant current interrogation circuit as described above for reducing the overall disturb potential impressed across the memory device such that the interrogation lifetime of the memory device may be significantly increased over the lifetime of memory devices subject to the prior art interrogation and sensing circuit systems.

The various features of novelty which characterize the invention are pointed out with particularity in the claims annexed to and forming a part of this specification. For a better understanding of the invention, its operating advantages and specific objects attained by its use, reference should be had to the accompanying drawings and descriptive matter in which there is illustrated and described a preferred embodiment of the invention.

DETAILED DESCRIPTION OF THE PREFERRED EMBODIMENTS

For a more complete appreciation of the invention, attention is invited to the following description of the illustrative embodiments of the invention as shown in the attached drawings.

Figure 1:
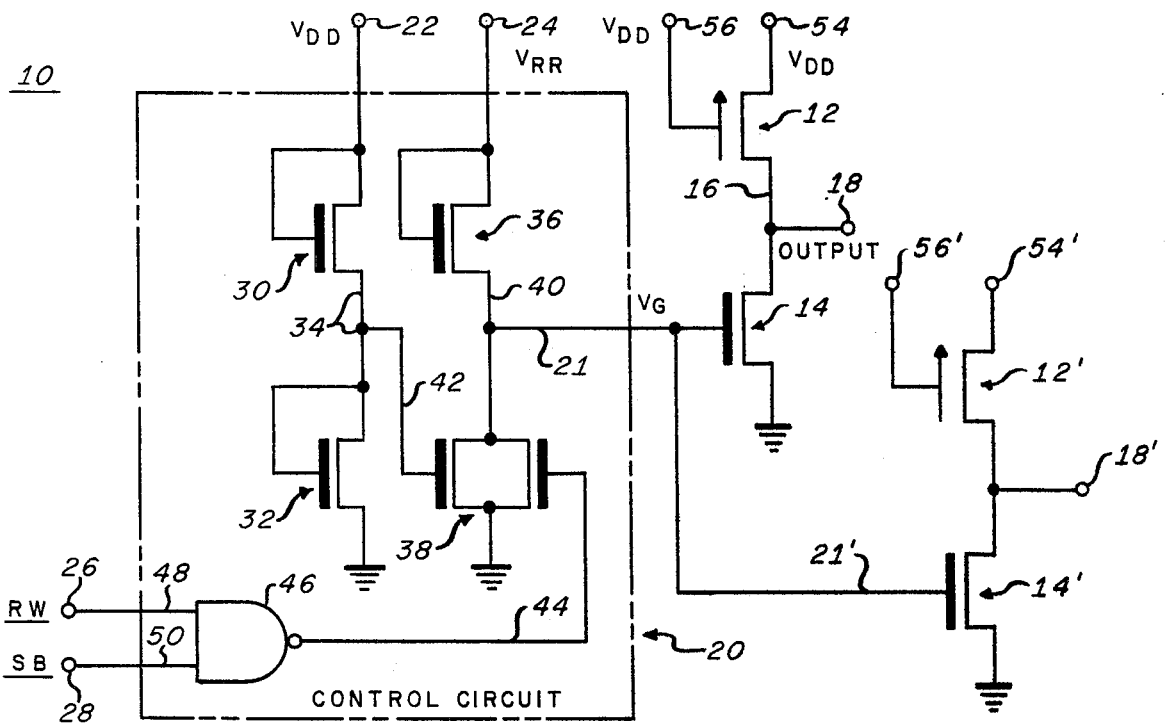
FIG. 1 is a schematic diagram illustrating a memory circuit employing the interrogation circuit of this invention.

Referring to FIG. 1, in which is shown the preferred embodiment of a memory-interrogation circuit 10 of this invention, a variable threshold insulated gate field effect transistor 12, having its source electrode coupled to the drain electrode of a fixed threshold field effect transistor 14 via a line 16, includes an output terminal 18 coupled to the line 16. The drain and gate electrodes of the variable threshold memory transistor 12 are connected to terminals 54, 56, respectively, for READ and WRITE operations of the transistor device 12, wherein the READ operation of this invention will be described below, whereas the fixed threshold field effect transistor 14 has its source electrode grounded and its gate electrode coupled to a control circuit 20, via a line 21, which controls the gate voltages of the transistor 14.

As illustrated in FIG. 1, the control circuit 20 includes a plurality of direct current (D.C.) terminals 22, 24 and control terminals 26 (RW) and 28 (SB). A field effect transistor FET 30, having its drain and gate electrodes connected together and to the direct current terminal 22, is coupled through its source electrode to the drain and gate electrodes of a field effect transistor (FET) 32 via line 34. The source electrode of the FET 32 is grounded. Moreover, a FET 36 having its drain and gate electrodes connected together and to the direct current terminal 24 has its source electrode coupled to the drain electrode of a field effect transistor FET pair 38. The FET pair 38 includes a pair of gate electrodes and a grounded source electrode. One gate electrode of FET 38 is connected via line 42 to the line 34, which couples the field effect transistors 30 and 32 to FETS 38 and 36. The other gate electrode of FET 38 is connected via line 44 to a NAND gate 46, which has its input terminals 48 and 50 connected to control terminals 26 and 28, respectively.

As illustrated in FIG. 1, the interrogation circuit of this invention comprises a plurality of fixed threshold field effect transistors (FETs) in order to achieve a memory configuration transistorized chip wholly comprised of devices compatible with the same microcircuit fabrication techniques required for the memory element 12 and to provide a constant current interrogation signal to be hereinafter described.

In the preferred embodiment of the memory-interrogation circuit 10 of this invention as shown in FIG. 1, the constant current condition is effected by operation of both the memory transistor 12 and the fixed threshold transistor 14 in current saturation $I_{(sat)}$. That is, if a first direct current supply voltage ($V_{DD}$) is applied to terminals 22, 56 and 54, a second direct current supply voltage ($V_{RR}$) is applied to terminal 24, and if a gate voltage ($V_G$) is applied to the fixed threshold transistor 14, the output voltage ($V_{OUT}$) of the memory transistor 12 and the disturb voltage ($V_{DIS}$) which affects the conduction threshold of the memory transistor 12 are described by the following equations:

$$I_{(SAT)} = K_{12}(V_{DD} - V_{OUT} - V_{T12})^2 = K_{14}(V_G - V_{T14})^2 \quad (1)$$

where $V_T$ is the threshold voltage of the transistors, $K$ is the gain of the transistors, and the subscripts 12, 14 indicate the corresponding FETs. Combining and rearranging terms:

$$V_{OUT} = V_{DD} - V_{T12} - \sqrt{K_{14}/K_{12}}(V_G - V_{T14}) \quad (2)$$

and $$V_{DIS_{12}} = V_{DD} - V_{OUT} - V_{T12} \quad (3)$$

therefore, substituting equation 2 into the corresponding term of equation 3, we see that $$V_{DIS_{12}} = \sqrt{K_{14}/K_{12}}(V_G - V_{T14}) \quad (4)$$

Accordingly, equation 4 shows that the disturb voltage ($V_{DIS}$) of the memory transistor 12 is a function of the gain ratio ($K_{14}/K_{12}$) of the fixed threshold transistor 14 to the memory transistor 12 and the "on drive" voltage ($V_G - V_{T14}$) of the fixed threshold transistor 14, wherein the gain ratio ($K_{14}/K_{12}$) is determined by the mask geometries used in fabricating the transistorized chip. Furthermore, in order to insure that the output voltage ($V_{OUT}$) from the memory device 12 is a true representation of the memory device's threshold, memory-interrogation must be performed at a constant current. However, the transistor 14, although a fixed threshold device, may experience variations in its threshold voltage ($V_{T14}$) as a function of process or fabrication variations, temperature and radiation exposure which would change the "on drive" voltage ($V_G - V_{T14}$) and accordingly the disturb voltage ($V_{DIS}$). Therefore, the gate voltage ($V_G$) must compensate for any variations in the threshold voltage of transistor 14 in order to operate FET 14 with a fixed "on drive" voltage and to insure that the output voltage ($V_{OUT}$) is a true representation of the memory devices threshold (HIGH or LOW).

In the preferred embodiment of this invention, control circuit 20 and, more particularly, transistors 30, 32 are designed to provide a fixed reference voltage to the gate of transistor pair 38 via line 42. That is, equating the current through transistors 30, 32 we have:

$$K_{30}(V_{DD} - V_{G38} - V_{T30})^2 = K_{32}(V_{G38} - V_{T32})^2 \quad (5)$$

and, if the control circuit 20 is fabricated as a single chip such that the threshold voltages ($V_T$) are equal and the gains ($k$) of the transistors 30, 32 are designed equal, equation 5 reduces to:

$$V_{G38} = V_{DD/2} \quad (6)$$

that is, the reference voltage to the gate of transistor 38 is independent of process variations and is determined by the power supply ($V_{DD}$). Furthermore, the operation of transistors 36, 38 which are connected as an inverter having ($V_{G38}$) as its input voltage is as follows:

$$K_{36}(V_{RR} - V_{T36} - V_G)^2 = K_{38}(V_{DD/2} - V_{T38})^2 \quad (7)$$

and, if the threshold volages of transistors 36, 38 are equal and the gain ratio ($K_{38}/K_{36}$) is set equal to 4, $V_G$ reduces to:

$$V_{G_{14}} = V_{RR} - V_{DD} + V_T \qquad (8)$$

Accordingly, equation 8 indicates that the output voltage ($V_G$) of the current source control circuit 20 provides a fixed "on drive" ($V_G - V_{T_{14}}$) for the transistor 14 that is equal to ($V_{RR} - V_{DD}$), when the fixed threshold voltage of all FETs on the chip are equal. And, an increase in the threshold voltage ($V_T$) of transistor 14 will result in an equal increase of output voltage ($V_G$), equation 8, to compensate therefor, thus maintaining a fixed "on drive" ($V_{RR} - V_{DD}$) and a constant current interrogation signal.

The output voltage from the memory transistor 12 as shown in the preferred embodiment is equal to the memory device's threshold voltage plus the voltage required to sustain the interrogation current through the device, and the magnitude of the sensing current is determined by the required transient performance and the memory device's direct current characteristics, wherein the voltage required to maintain this sensing current is set by the mask geometry of the device.

Figure 2:
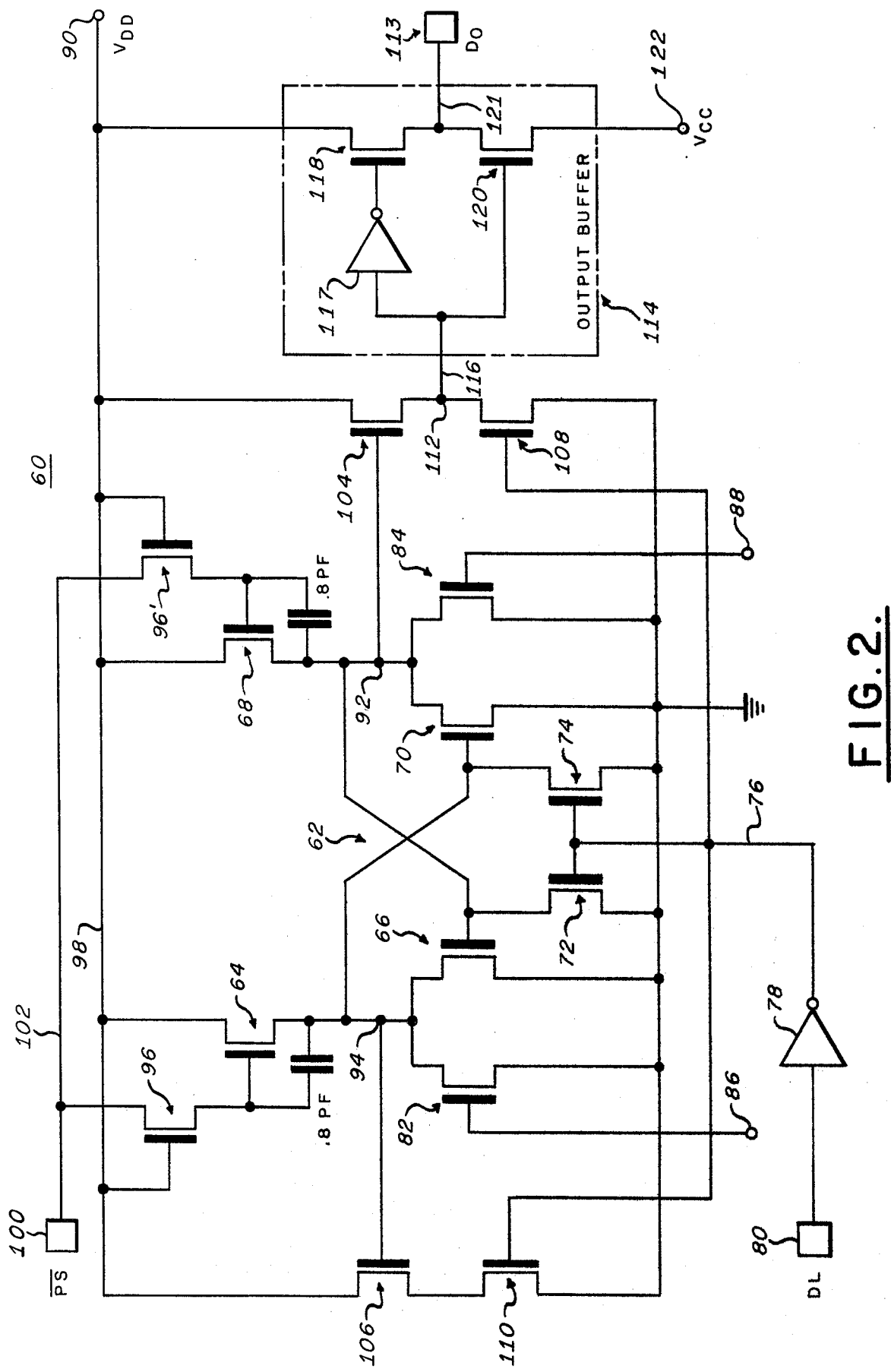
FIG. 2 is a schematic diagram illustrating the sense/latch circuit of this invention.

Referring now to FIG. 2, the preferred embodiment of a sense/latch circuit 60 of this invention includes a latch circuit 62 having a plurality of fixed threshold field effect transistors, 64, 66 and 68, 70 wired in a cross-coupled configuration wherein the field effect transistors 66 and 70 have their gate electrodes coupled to fixed threshold field effect transistors 72, 74, respectively, whose gates are interconnected. The coupled gates of field effect transistors 72 and 74 are connected via a line 76 to an inverter 78 and to a data latch (DL) control input 80. Field effect transistors 66 and 70 are each connected in parallel to a fixed threshold field effect transistor 82, 84, respectively. The gate electrodes of field effect transistors 82, 84 are connected to input terminals 86, 88, respectively, to which the output from memory transistors may be coupled as hereinafter described to provide a high impedance gate input to the latch circuit 62. In addition, the source electrodes of transistors 66, 70, 72, 74, 82 and 84 are grounded. The sense/latch circuit 60 of this invention further includes a terminal 90 for direct current supply ($V_{DD}$), latch circuit output terminals 92 and 94, and "bootstrapping" circuits 96 and 96'. The "bootstrapping" circuits 96 and 96' interconnect the latching circuit 62 to the direct current supply terminal 90 via a line 98, and to a power supply (PS) control input 100 via a line 102. Coupled to the output terminals 92 and 94 is the gate electrode of a fixed threshold field effect transistor 104 and 106, respectively. The drain electrodes of the transistors 104, 106 are each coupled to the terminal 90 and the associated direct current supply ($V_{DD}$), whereas, the source electrodes are each coupled through the drain electrode of an intermediate fixed threshold field effect transistor 108 and 110, respectively, to ground. That is, the FETs 108 and 110 have their source electrodes grounded and their gate electrodes interconnected, and aid in equally matching the capacitive loading at output terminals 92 and 94 to prevent a preferred switching direction of latch circuit 62 from developing.

A terminal 112 interconnected between the source and drain electrodes of transistors 104, 108, respectively, couples the output 92 to an output terminal (DO) 113 through an output buffer 114 via a line 116. The output buffer 114 includes a pair of fixed threshold transistors 118 and 120 whose source and drain electrodes, respectively, are interconnected and coupled via a line 121 to the data output 113 (DO). The source electrode of transistor 118 is coupled to the terminal 90 and the associated power supply ($V_{DD}$), and the source electrode of transistor 120 is coupled to a direct current supply $V_{CC}$ 122. Moreover, the gate electrode of transistor 120 is coupled to the line 116, whereas the gate electrode of transistor 118 is coupled through an inverter 117 to the line 116.

It should be noted that the preferred embodiment disclosed above refers to the operation of a P-channel fabrication of the technique, and that, one skilled in the art would readily recognize that the operation could be implemented by an N-channel technology with the appropriate changes in polarities of the applied signals.

The operation of the memory-interrogation circuit 10 and the sense/latch circuit 60 of this invention will now be described in reference to FIGS. 1 and 2 and the timing diagrams of FIG. 3. Furthermore, the operation of this invention will be described in reference to differential memory-interrogation, i.e., a memory circuit which includes a second memory element as shown in FIG. 1, having a memory transistor 12' similar to the memory transistor 12, an output 18' similar to the output 18, and a constant current transistor 14' whose gate electrode is also coupled to ($V_G$) via line 21'. In this manner, binary data is read out of a differential memory device, i.e., memory transistors 12 and 12', in accordance with which memory transistor has the highest voltage output (HIGH). The READ mode of operation will now be described wherein it is assumed that binary information has been written into the differential memory elements, i.e., a HIGH threshold voltage in one memory element and a LOW threshold voltage in the other. Accordingly, in the preferred embodiment of this invention which includes a power supply (PS), the supply (PS) 100 (FIG. 2) must be on, i.e., set LOW $V_{DD}$ (negative) for operation of the circuit, which is indicated by the pulse 130 of the (PS) diagram of FIG. 3 at a time ($t_1$). The control input terminals 26 and 28 are each set HIGH (ground) by their respective control inputs (RW) and (SB) as shown by diagrams 132 and 134, respectively, at time ($t_1$); the terminals 22 and 24 are set at their LOW direct current values ($V_{DD}$ and $V_{RR}$), respectively; and, the memory transistors(12, 12')drain and gate electrodes 54, 54' and 56, 56' are at time ($t_1$) set HIGH (ground). For purposes of explanation of the operation of this invention it is assumed that the d.c. voltages applied to the drain 54, 54' and gate terminals 56, 56' are set by the control input (SB) and a representative input (ME), shown in timing diagrams 134 and 136 of FIG. 3, respectively. The HIGH voltages applied to terminals 26 and 28 are transmitted through terminals 48 and 50, respectively, to the NAND gate 46, which produces a LOW voltage output which is coupled through line 44 to the gate of transistor pair 38 turning on the transistor pair 38 and shorting the output ($V_G$) to HIGH (ground) voltage. With ($V_G$) set HIGH, the transistors 14 and 14' are turned off and no current is generated to interrogate the differential memory transistors 12 and 12'. In addition, the control terminal 80 (FIG. 2) of the control input (DL) is also set HIGH, see timing diagram 138, (FIG. 3), which coupled through the inverter 78 (FIG. 2) produces a LOW output voltage on line 76. The LOW output from inverter 78 turns on gates 72 and 74 forcing the outputs at terminals 92, 94 to HIGH (ground) which, in turn, turns off transistor 104 and disables the output buffer 114. The disabled transistor 104, moreover, causes a HIGH (ground) voltage on line 116 which is applied to the gate of transistor 120, turning off the transistor, and to the inverter 117. The HIGH at inverter 117 is changed to a LOW voltage at the output thereof which, when applied to transistor 118, turns on transistor 118 allowing the output 113 to go LOW (negative). That is, (DO) 113 approaches the direct current voltage ($V_{DD}$) of terminal 90, preconditioning the circuit or, more specifically, preconditioning the output (DO) LOW, as shown in timing diagram 140.

With the interrogation circuit 10 and the sense/latch circuit 60 set as indicated above, interrogation of the memory proceeds as follows: at time $t_2$ the control input 28 (SB) is set LOW (negative) at the value $V_{DD}$ (see diagram 134, FIG. 3). As explained above, in the preferred embodiment of this invention the control input (SB) also sets the d.c. voltage to terminal 54 and 54' of the drain electrode of the memory device 12 and 12'. Accordingly, at time $t_2$ the control inputs at terminals 26 RW and 28 SB of control circuit 20 are set HIGH and LOW, respectively, which, coupled to the NAND gate 46, produces a HIGH voltage at the output thereof and at the gate of transistor 38 via line 44. The HIGH voltage supplied to the gate of transistor 38 via line 44 turns half of the transistor off and the voltage $V_G$ on. As $V_G$ approaches its value indicated by equation 8, the transistors 14 and 14' turn on establishing current flow for reading of the memory elements. The gate electrode terminals 56 and 56' are then, at time $t_3$ (FIG. 3) set to the LOW voltage $V_{DD}$ where in this embodiment of the invention they are set by the input represented by (ME) 136 of FIG. 3. The LOW voltage $V_{DD}$ applied to the gates of the memory transistors 12 and 12' turns the memory transistors on and the interrogtion current from transistors 14 and 14' READS the memory devices 12 and 12', i.e., produces a voltage output from each memory device in response to its respective threshold voltage representative of binary data stored therein. The output from memory transistor 12 is coupled to the sense/latch circuit 60 at terminal 86, for example, and the output from memory transistor 12' is coupled to the other input terminal, 88. It is noted that the sense/latch circuit 60 of this invention may be used with a single memory device 12 applied to one of its input terminals wherein a direct current voltage supply intermediate between the HIGH and LOW threshold voltages of the memory device is applied to the other input terminal for sensing of the binary information stored in the single memory device by the sense/latch circuit 60 of this invention. After initiation of the (ME) input to terminals 56 and 56', at time $t_3$, the output of the memory transistors is allowed to charge up to its output value for a sufficient or charging time $t_4$ in FIG. 3, at which time the data latch (DL) control input 80 is pulsed to a LOW voltage $V_{DD}$, see diagram 138 of FIG. 3. The LOW voltage is inverted through inverter 78 to a HIGH voltage which turns off transistors 72 and 74, releases the flip-flop outputs 92 and 94 and allows them to charge toward the direct current voltage $V_{DD}$. The binary output information of the memory transistors 12 and 12' applied to input terminals 86 and 88 cause a current to flow in transistors 82 and 84 according to the voltage level applied to the terminals 86 and 88 which, in turn, determines which output 92 or 94 of the latching circuit 62 reaches the latching voltage $V_{DD}$ first.

Figure 3:
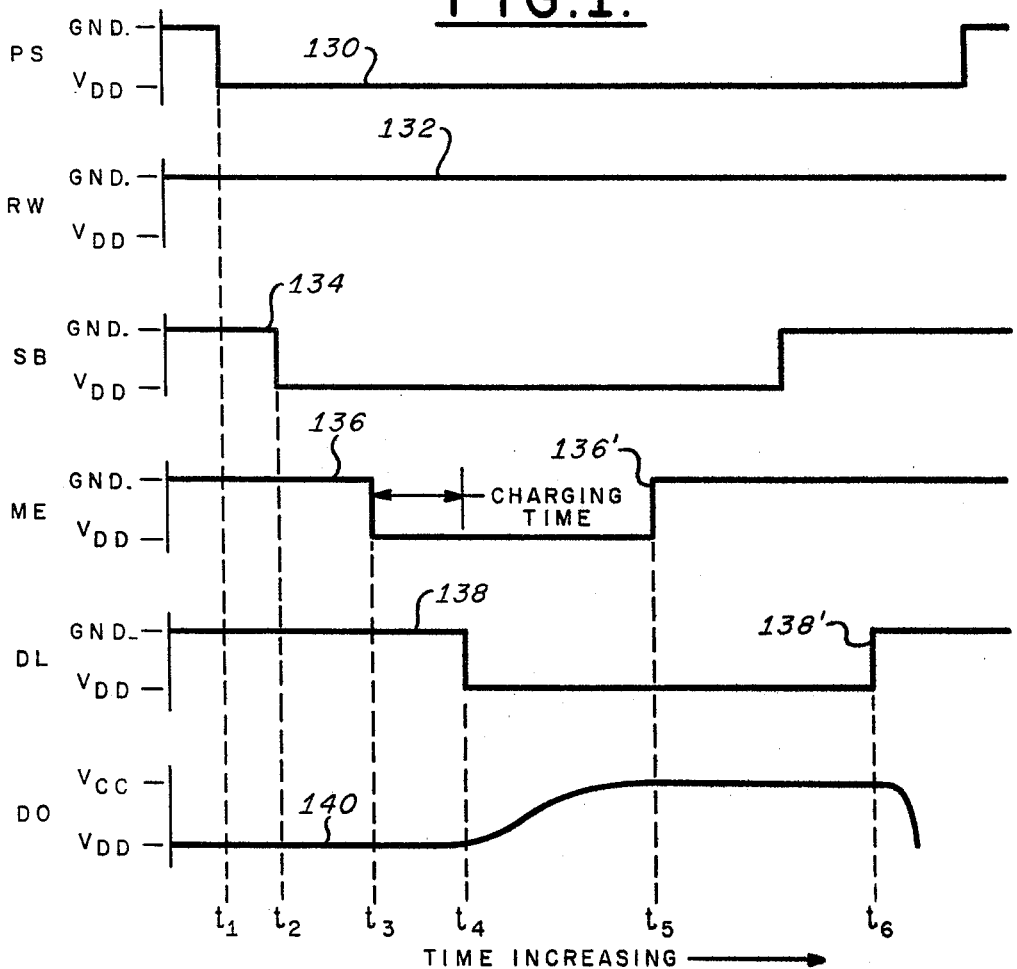
FIG. 3 illustrates timing diagrams useful in explaining the operation of the memory and sense/latch circuits of this invention.

Once the voltage at output 92 which is coupled to transistor 104 becomes valid as, for example, indicated at time $t_5$ of FIG. 3, the (ME) 56, 56', 136 input, that is, the direct current voltage supply applied to the gate of the memory transistor is no longer necessary and may be turned off as indicated at 136'. The valid data or voltage, however, continues to propagate through transistor 104 and the output buffer 114 to the data output (DO) 113 setting the output (DO) HIGH ($V_{CC}$) or causing no change in (DO) from its preconditioned state, i.e., LOW ($V_{DD}$). The control input DL is turned off as indicated at 138' any time ($t_6$) after the data is recognized. For example, in the preferred embodiment of this invention the HIGH and LOW threshold voltages of the memory transistors 12 and 12' were −2v and −8v, respectively, as set by WRITE voltages of +30v and −30v, respectively. The direct current voltage $V_{DD}$ was set at −15v, and the disturb voltage ($V_{DIS}$) of the memory interrogation circuit was calculated as approximately 1 volt. Accordingly, from equation 2 the output voltage of the memory transistor if set HIGH, i.e., at −2v, was equal to −13 volts, and if set LOW, i.e., at −8v, was equal to −6v. Therefore, if the binary data of memory transistor 12 is set HIGH (−2v), which results in a more negative output (−13v) than the output (−6v) data of memory transistor 12', set LOW, then the current flow through transistor 82 will be greater than the current flow through transistor 84 causing transistor 66 to charge quicker than transistor 70 and turn on before transistor 70, resulting in output 92 latching to the LOW ($V_{DD}$) voltage and the output 94 latching to HIGH (ground) voltage. The LOW voltage at output 92 turns on the transistor 104 and propagates through line 116 where it turns on the transistor 120, and is inverted through inverter 117, turning off the transistor 118. Because the transistor 118 is turned off and the transistor 120 is turned on, the data ouput (DO) 113 approaches the higher direct current voltage $V_{CC}$, correctly indicating a HIGH for the binary data in memory transistor 12, which is the assumed condition for this example. In like manner, if memory transistor 12' was set at a higher threshold voltage than memory transistor 12, then the input to terminal 88 would cause the latching circuit 62 to latch such that terminal 94 latched to the low ($V_{DD}$) voltage and terminal 92 latched to HIGH (ground) voltage. The HIGH (ground) voltage applied to the gate of transistor 104 would not turn on transistor 104 and the output at 113 (DO) would not change from its precondition LOW state, thereby indicating that the input at terminal 88 had the higher voltage and, accordingly, memory transistor 12' was set at the higher binary data state, or memory transistor 12 was set LOW.

In accordance with the memory interrogation circuit 10 and the sense/latch circuit 60 of this invention, an interrogation circuit is provided which overcomes the difficulties of the prior art interrogation of memory devices by substantially reducing the disturb potential impressed across a memory transistor device during interrogation and is a constant and calculable quantity for all interrogations of the device. Furthermore, the sense/latch circuit of this invention includes a high impedance gate input as the connection to the memory transistor to eliminate any feedback effect to the memory device and thereby also reduce the disturb potential impressed across the insulator of the memory transistor.

While the invention has been described in its preferred embodiments, it is to be understood that the words which have been used are words of description rather than limitation and that changes within the purview of the appended claims may be made without departing from the true scope and spirit of the invention in its broader aspects.

I claim:

1. A method of interrogating a variable threshold field effect transistor comprising the steps of,
    coupling an electrode of a field effect transistor to one electrode of the variable threshold field effect transistor,
    biasing the gate and other electrodes of said variable threshold field effect transistor,
    and biasing the gate electrode of said field effect transistor with a fixed on drive voltage for generating a constant current to interrogate said variable threshold field effect transistor.

2. A memory device of the type having a memory cell comprising,
    a field effect transistor coupled in series with said memory cell for applying a current signal thereto, and
    a control voltage source coupled to the gate of said field effect transistor for providing a control voltage thereto, said control voltage increasing or decreasing directly with changes in the threshold voltage of said field effect transistor thereby providing a fixed on drive voltage for maintaining the current signal constant.

3. A memory device according to claim 2, further including a sense latch circuit coupled to the output of the memory cell.

4. A memory device according to claim 3 wherein said sense/latch circuit includes
    a plurality of field effect transistors cross coupled in a latching configuration, said cross coupled transistors each having an output,
    the output of the variable threshold transistor device being coupled between the output and an electrode of one of the cross coupled transistors, and
    a reference voltage being coupled between the output and an electrode of the other cross coupled transistor.

5. A memory device according to claim 2, wherein said control voltage source includes a plurality of fixed threshold field effect transistors.

6. A memory device according to claim 5 wherein said field effect transistor comprises a fixed threshold insulated gate field effect transistors.

7. A memory device according to claim 5 wherein said control voltage source includes a first pair of field effect transistors connected in series as a voltage divider providing a fixed output therebetween coupled to a second pair of field effect transistors for providing the control voltage therefrom.

8. A memory device according to claim 7 wherein said memory cell comprises a variable threshold insulated gate field effect transistor.

9. A memory device according to claim 7 wherein said field effect transistors comprise insulated gate field effect transistors fabricated on a single chip.

10. A memory device according to claim 7 wherein the first pair of field effect transistors have a gain ratio of one and the second pair of field effect transistors have a gain ratio $(K_{38}/K_{36})$ of four.

* * * * *